(12) United States Patent
She et al.

(10) Patent No.: US 12,156,387 B2
(45) Date of Patent: Nov. 26, 2024

(54) PACKAGING OF POWER CONVERSION UNIT

(71) Applicant: Carrier Corporation, Palm Beach Gardens, FL (US)

(72) Inventors: Xu She, Cohoes, NY (US); XuQiang Liao, Manlius, NY (US); Vinay Kumar Vinnakota, Telangana (IN); Vijaylakshmi Bondapalli, Telangana (IN); Sridhar Adibhatla, Telangana (IN); Daxesh Kishor Pandya, Telangana (IN)

(73) Assignee: CARRIER CORPORATION, Palm Beach Gardens, FL (US)

( * ) Notice: Subject to any disclaimer, the term of this patent is extended or adjusted under 35 U.S.C. 154(b) by 288 days.

(21) Appl. No.: 17/720,784

(22) Filed: Apr. 14, 2022

(65) Prior Publication Data
US 2022/0338390 A1      Oct. 20, 2022

Related U.S. Application Data

(60) Provisional application No. 63/175,084, filed on Apr. 15, 2021.

(51) Int. Cl.
*H02M 7/00* (2006.01)
*H05K 7/20* (2006.01)

(52) U.S. Cl.
CPC ........ *H05K 7/20909* (2013.01); *H02M 7/003* (2013.01)

(58) Field of Classification Search
CPC .. H05K 7/209; H05K 7/1432; H05K 7/14322; H05K 7/20918; H05K 7/20127;
(Continued)

(56) References Cited

U.S. PATENT DOCUMENTS

| 5,485,350 A |   | 1/1996 | Hecht et al. |
| 5,926,367 A | * | 7/1999 | Gutierrez ............... G06F 1/26 361/695 |

(Continued)

FOREIGN PATENT DOCUMENTS

| CN | 202798488 U | 3/2013 |
| CN | 109087773 A | 12/2018 |

(Continued)

OTHER PUBLICATIONS

Search Report for European Application No. 22164548.4 issued Aug. 29, 2022.

*Primary Examiner* — Mandeep S Buttar
(74) *Attorney, Agent, or Firm* — CANTOR COLBURN LLP

(57) ABSTRACT

A mechanical assembly includes a power semiconductor device located inside of a mechanical enclosure, and a magnetic component located outside of the mechanical enclosure and operably connected to the power semiconductor device. The power semiconductor device and the magnetic component are cooled via a common air pathway outside of the mechanical enclosure. A power converter includes a powered semiconductor device located inside of a mechanical enclosure, the power semiconductor device configured to convert DC input power to AC output power, and an inductor located outside of the mechanical enclosure and operably connected to the power semiconductor device. The power semiconductor device and the magnetic component are cooled via a common air pathway outside of the mechanical enclosure.

14 Claims, 11 Drawing Sheets

(58) Field of Classification Search
CPC ........... H05K 7/20145; H05K 7/20172; H05K 7/20418; H05K 7/20409; H05K 7/20545; H05K 7/20909; H05K 7/2089; G06F 1/20; G06F 1/26; G06F 1/189; H01F 27/08

See application file for complete search history.

(56) References Cited

U.S. PATENT DOCUMENTS

| | | | |
|---|---|---|---|
| 7,289,329 B2 | 10/2007 | Chen et al. | |
| 7,561,429 B2 | 7/2009 | Yahata et al. | |
| 8,169,780 B2 | 5/2012 | Yoshino et al. | |
| 8,240,411 B2 | 8/2012 | Nakatsu et al. | |
| 8,488,319 B2 * | 7/2013 | Santos | H02M 7/003 |
| | | | 363/141 |
| 8,520,381 B2 | 8/2013 | Hobein et al. | |
| 8,811,016 B2 | 8/2014 | You et al. | |
| 9,167,729 B2 | 10/2015 | Liu | |
| 9,247,675 B2 | 1/2016 | Higuchi et al. | |
| 9,429,151 B2 | 8/2016 | Taras et al. | |
| 9,485,891 B2 | 11/2016 | Huesgen et al. | |
| 9,668,384 B2 | 5/2017 | You et al. | |
| 9,913,356 B2 | 3/2018 | Rostamzadeh et al. | |
| 10,286,788 B2 | 5/2019 | Masip | |
| 10,355,608 B2 | 7/2019 | Chow et al. | |
| 10,764,988 B2 * | 9/2020 | Wada | H04N 23/56 |
| 2006/0044762 A1 * | 3/2006 | Kikuchi | H05K 7/209 |
| | | | 257/E23.105 |
| 2006/0176666 A1 * | 8/2006 | Saturley | G06F 1/20 |
| | | | 361/679.46 |
| 2011/0141688 A1 * | 6/2011 | Li | G06F 1/20 |
| | | | 361/679.46 |
| 2015/0245537 A1 * | 8/2015 | Sakuma | H05K 7/20918 |
| | | | 363/141 |
| 2018/0174731 A1 | 6/2018 | Fukuchi et al. | |
| 2021/0258031 A1 * | 8/2021 | Ostrin | H05K 7/20145 |
| 2023/0225091 A1 * | 7/2023 | She | H05K 7/209 |
| | | | 361/710 |

FOREIGN PATENT DOCUMENTS

| | | |
|---|---|---|
| EP | 2424054 A1 | 2/2012 |
| EP | 2844052 A2 | 3/2015 |
| EP | 3001786 B1 | 3/2016 |
| JP | 5877369 B2 | 2/2016 |
| JP | 6028222 B2 | 11/2016 |
| JP | 6384313 B2 | 9/2018 |
| JP | 6524415 B2 | 6/2019 |
| WO | 2008071192 A1 | 6/2008 |
| WO | 2012158304 A1 | 11/2012 |
| WO | 2020186349 A1 | 9/2020 |
| WO | 2020260465 A1 | 12/2020 |

\* cited by examiner

PACKAGING OF POWER CONVERSION UNIT

CROSS-REFERENCE TO RELATED APPLICATIONS

This application claims the benefit of U.S. Provisional Application No. 63/175,084 filed Apr. 15, 2021, the disclosure of which is incorporated herein by reference in its entirety.

BACKGROUND

Exemplary embodiments pertain to the art of transport refrigeration units, and in particular to packaging of power converters for transport refrigeration units.

Power converters for transport refrigerant unit sometimes requires a high ingress protection (IP) rating as well as air-cooled thermal management. In addition, a power converter with a magnetic component may be needed to extend the operating voltage range. These unique requirements pose challenges in designing a high-density mechanical package. For instance, the magnetic component may not be put together with other electronics inside of the enclosure due to high operating temperature. On the other hand, two separate mechanical enclosures for the power conversion unit can make the package large and cooling design difficult.

BRIEF DESCRIPTION

In one embodiment, a mechanical assembly includes a power semiconductor device located inside of a mechanical enclosure, and a magnetic component located outside of the mechanical enclosure and operably connected to the power semiconductor device. The power semiconductor device and the magnetic component are cooled via a common air pathway outside of the mechanical enclosure.

Additionally or alternatively, in this or other embodiments a heat sink is located outside of the mechanical enclosure in the common air pathway, the heat sink operably connected to the power semiconductor device.

Additionally or alternatively, in this or other embodiments the mechanical enclosure is secured to the heat sink.

Additionally or alternatively, in this or other embodiments a heat sink gasket is located between the mechanical enclosure and the heat sink to seal an interface between the mechanical enclosure and the heat sink.

Additionally or alternatively, in this or other embodiments the power semiconductor device is operably connected to the heat sink via one or more opening in the mechanical enclosure inside of a perimeter defined by the heat sink gasket.

Additionally or alternatively, in this or other embodiments the magnetic component and the mechanical enclosure are secured to a common base plate.

Additionally or alternatively, in this or other embodiments the mechanical enclosure includes a base surface secured to the base plate, a shelf surface vertically offset from the bottom surface, and an upright surface extending between the base surface and the shelf surface.

Additionally or alternatively, in this or other embodiments the power semiconductor device is operably connected to the magnetic component via a shelf port formed in the shelf surface.

Additionally or alternatively, in this or other embodiments one or more of a grommet and/or a potting compound are located at the shelf port.

Additionally or alternatively, in this or other embodiments a cover is installed to the mechanical enclosure.

In another embodiment, a power converter includes a powered semiconductor device located inside of a mechanical enclosure, the power semiconductor device configured to convert DC input power to AC output power, and an inductor located outside of the mechanical enclosure and operably connected to the power semiconductor device. The power semiconductor device and the magnetic component are cooled via a common air pathway outside of the mechanical enclosure.

Additionally or alternatively, in this or other embodiments the power semiconductor device includes a printed circuit board assembly.

Additionally or alternatively, in this or other embodiments a heat sink is located outside of the mechanical enclosure in the common air pathway. The heat sink is operably connected to the power semiconductor device.

Additionally or alternatively, in this or other embodiments mechanical enclosure is secured to the heat sink.

Additionally or alternatively, in this or other embodiments a heat sink gasket is located between the mechanical enclosure and the heat sink to seal an interface between the mechanical enclosure and the heat sink.

Additionally or alternatively, in this or other embodiments the power semiconductor device is operably connected to the heat sink via one or more opening in the mechanical enclosure inside of a perimeter defined by the heat sink gasket.

Additionally or alternatively, in this or other embodiments the inductor and the mechanical enclosure are secured to a common base plate.

Additionally or alternatively, in this or other embodiments the mechanical enclosure includes a base surface secured to the base plate, a shelf surface vertically offset from the bottom surface, and an upright surface extending between the base surface and the shelf surface.

Additionally or alternatively, in this or other embodiments the power semiconductor device is operably connected to the inductor via a shelf port formed in the shelf surface.

Additionally or alternatively, in this or other embodiments one or more of a grommet and/or a potting compound is located at the shelf port.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

The present disclosure describes and illustrates a power converter arrangement and a method of assembling a power converter structure. The disclosure enables a single cooling fan set to cool both a power semiconductor device and a magnetic component of the power converter. The arrangement achieves a high ingress protection (IP) rating, while providing a compact solution that meets constrained space requirements. IP rating is recognized in industry as a standard for classifying and rating the degree of protection provided by mechanical casings and electrical enclosures against intrusion, dust, accidental contact and water.

Figure 1:
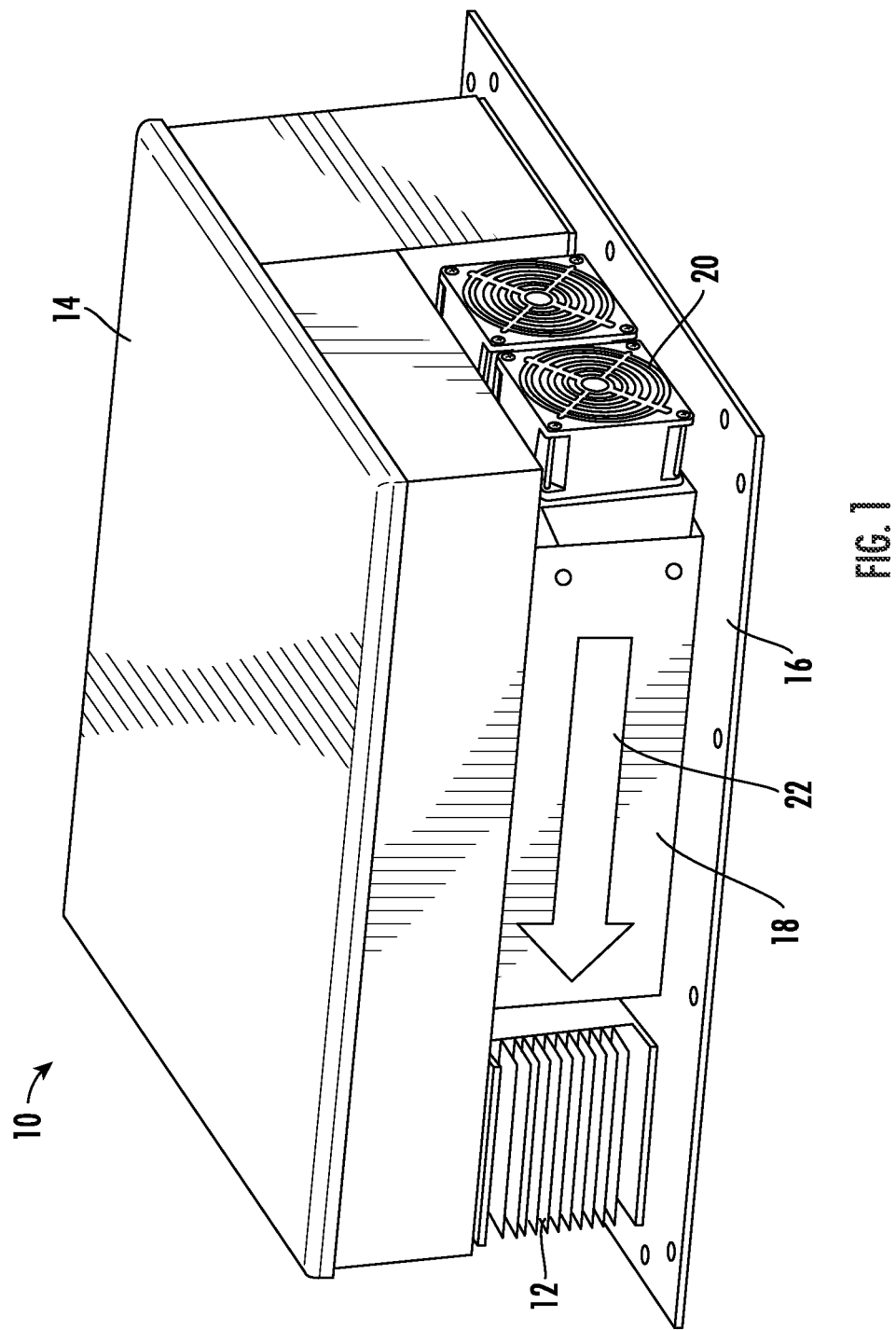
FIG. 1 is a perspective view of an embodiment of a mechanical assembly.
Figure 2:
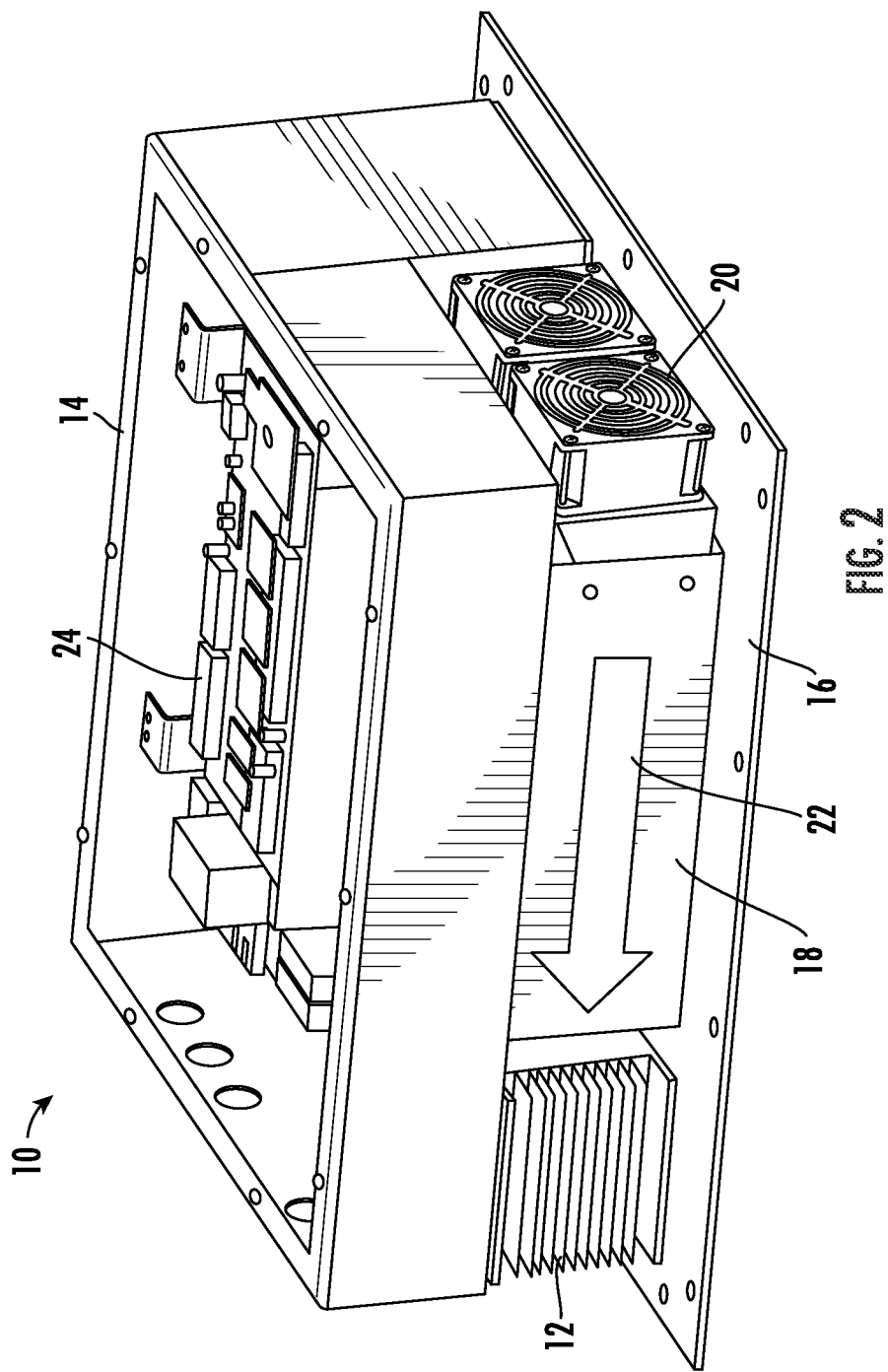
FIG. 2 is another perspective view of an embodiment of a mechanical assembly.

Referring to FIG. 1, an embodiment of a power converter 10 (which may be referred to as a mechanical assembly) includes a magnetic component, such as an inductor 12, and a mechanical enclosure 14. As shown in FIG. 1, the inductor 12 and the mechanical enclosure 14 may be secured to a base plate 16, with the inductor 12 located outside of the mechanical enclosure 14. Each of the inductor 12 and the mechanical enclosure 14 are configured with a high IP rating, e.g. IP65 or above. A heat sink 18 and a fan unit 20 may also be secured to the base plate 16 outside of the mechanical enclosure 14. The heat sink 18 and fan unit 20 are configured dissipate thermal energy from both the inductor 12 and electronic components inside the mechanical enclosure 14 via a shared air pathway 22. In some embodiments such as shown in FIG. 1, the heat sink 18 and fan unit 20 are disposed vertically beneath the mechanical enclosure 14, and upstream from the inductor 12, with respect to a direction of airflow along the shared air pathway 22. As shown in FIG. 2, the mechanical enclosure 14 contains one or more electronic components, such as a printed circuit board assembly (PCBA) 24. The electronics components may be configured as a power semiconductor device to convert DC input power into AC output power.

Figure 3:
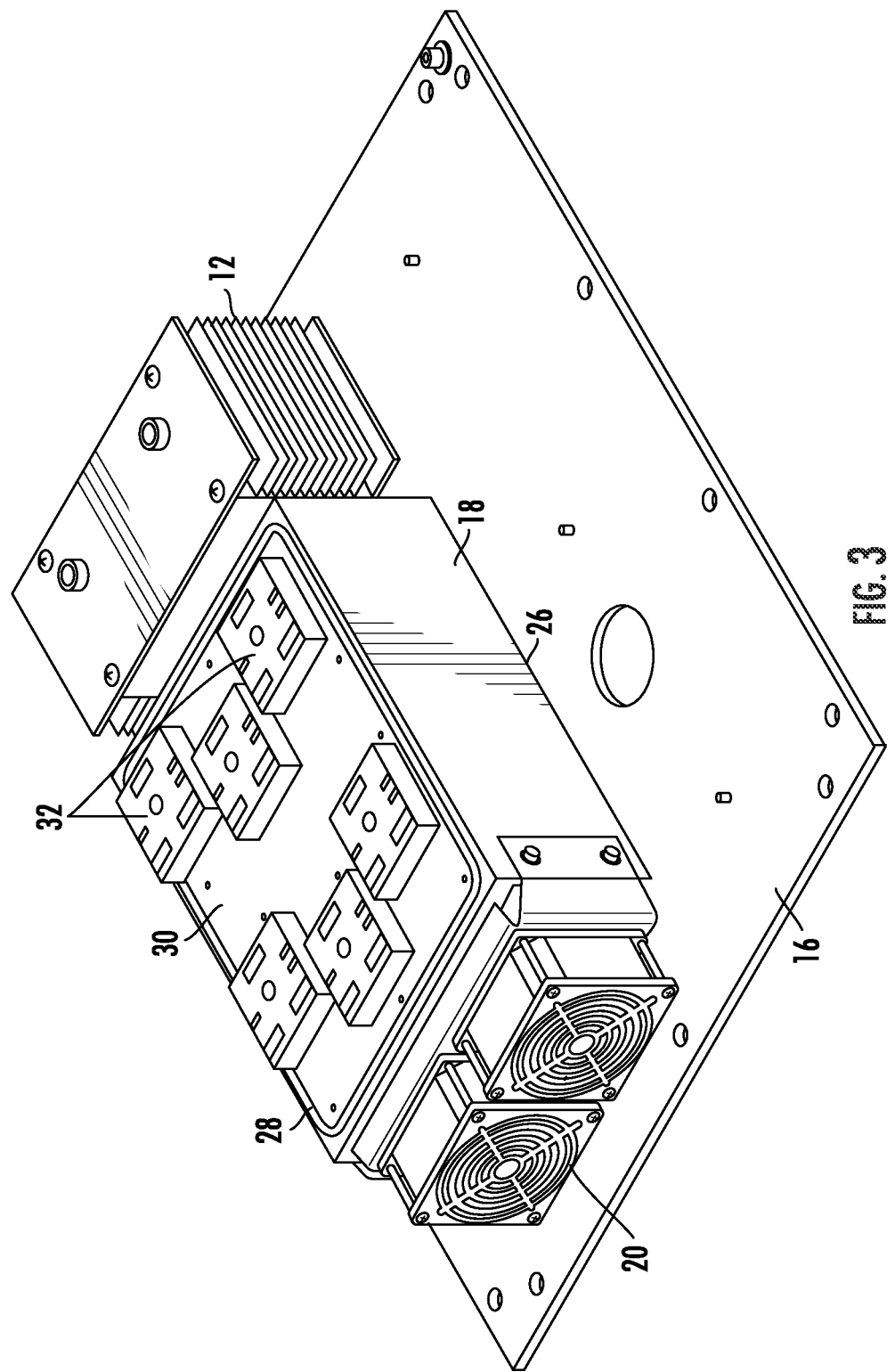
FIG. 3 is a perspective view illustrating a heat sink and magnetic component installed to a base plate.

Beginning with FIG. 3, the structure of embodiments of the power converter 10 will be described by way of a description of an assembly sequence thereof. FIG. 3 illustrates the inductor 12, the heat sink 18 and the fan unit 20 installed to the base plate 16, in some embodiments by screws or bolts. A bottom surface 26 of the heat sink 18 is installed to the base plate 16, while a heatsink gasket 28 is installed to a top surface 30 of the heatsink 18, opposite the bottom surface 26. Further, one or more insulated-gate bipolar transistors (IGBT's) 32 are installed to the top surface 30, inside of a perimeter defined by the heatsink gasket 28. While IGBT's 32 are illustrated in FIG. 3 and described herein, one skilled in the art will appreciate that in other embodiments other switching elements may be utilized.

Figure 4:
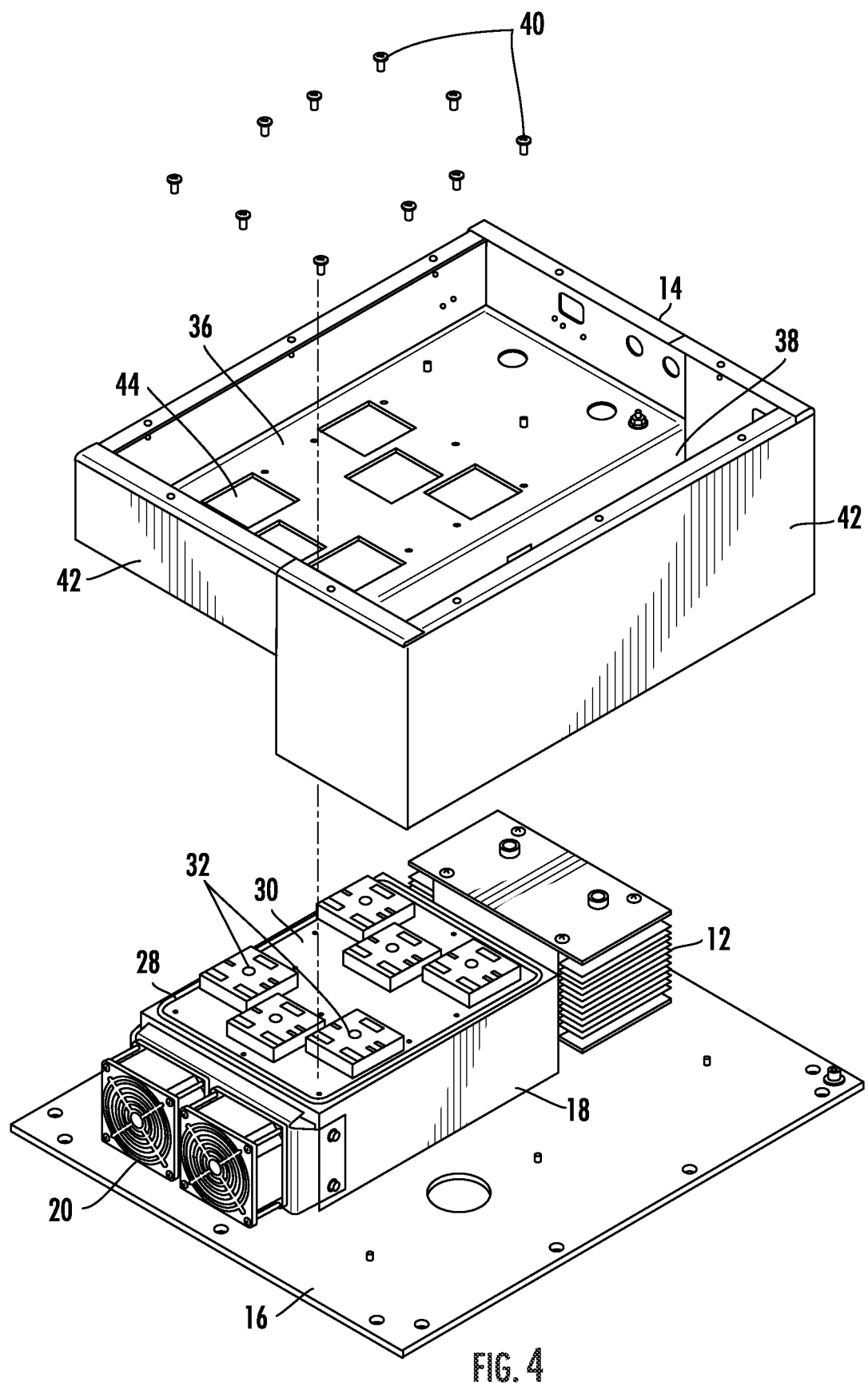
FIG. 4 is a perspective view illustrating installation of a mechanical enclosure to the heat sink and base plate.
Figure 5:
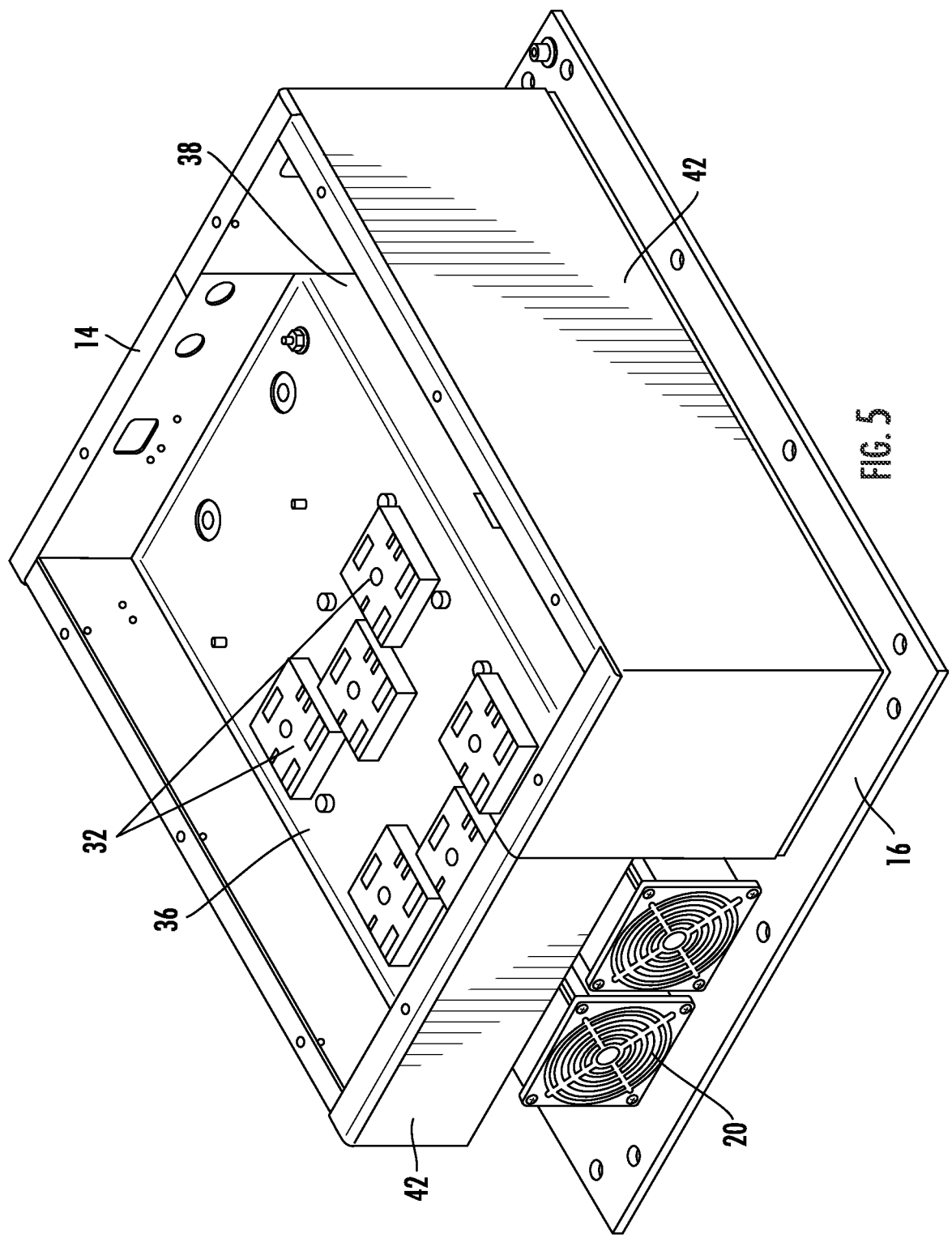
FIG. 5 is a perspective view illustrating the mechanical enclosure installed to the heat sink and base plate.
Figure 6:
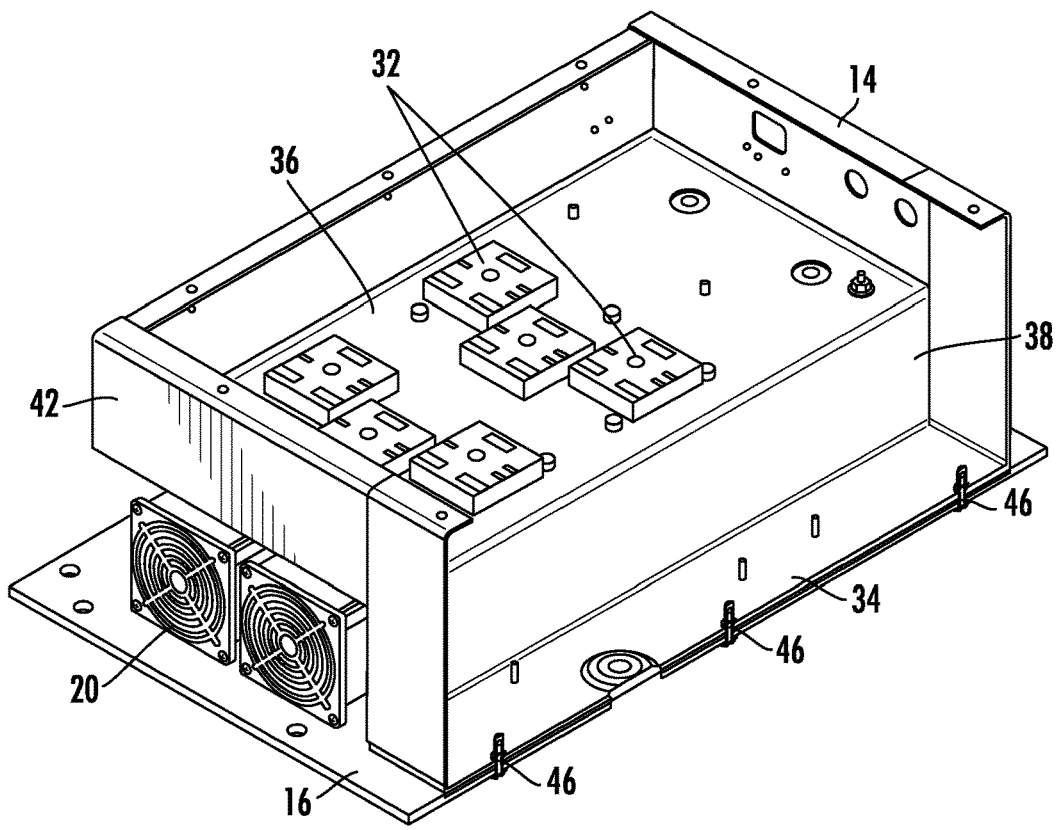
FIG. 6 is a partial cross-sectional view of an embodiment of a mechanical assembly.
Figure 7:
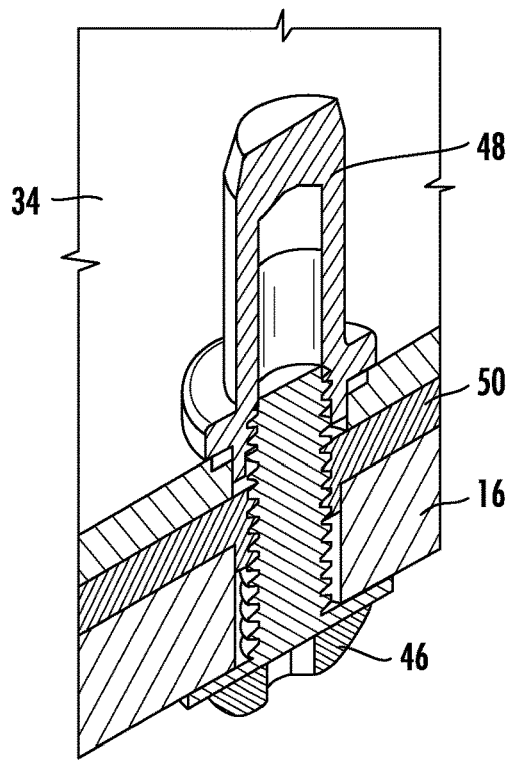
FIG. 7 is a partial cross-sectional view illustrating securing of the mechanical enclosure to the base plate.
Figure 8:
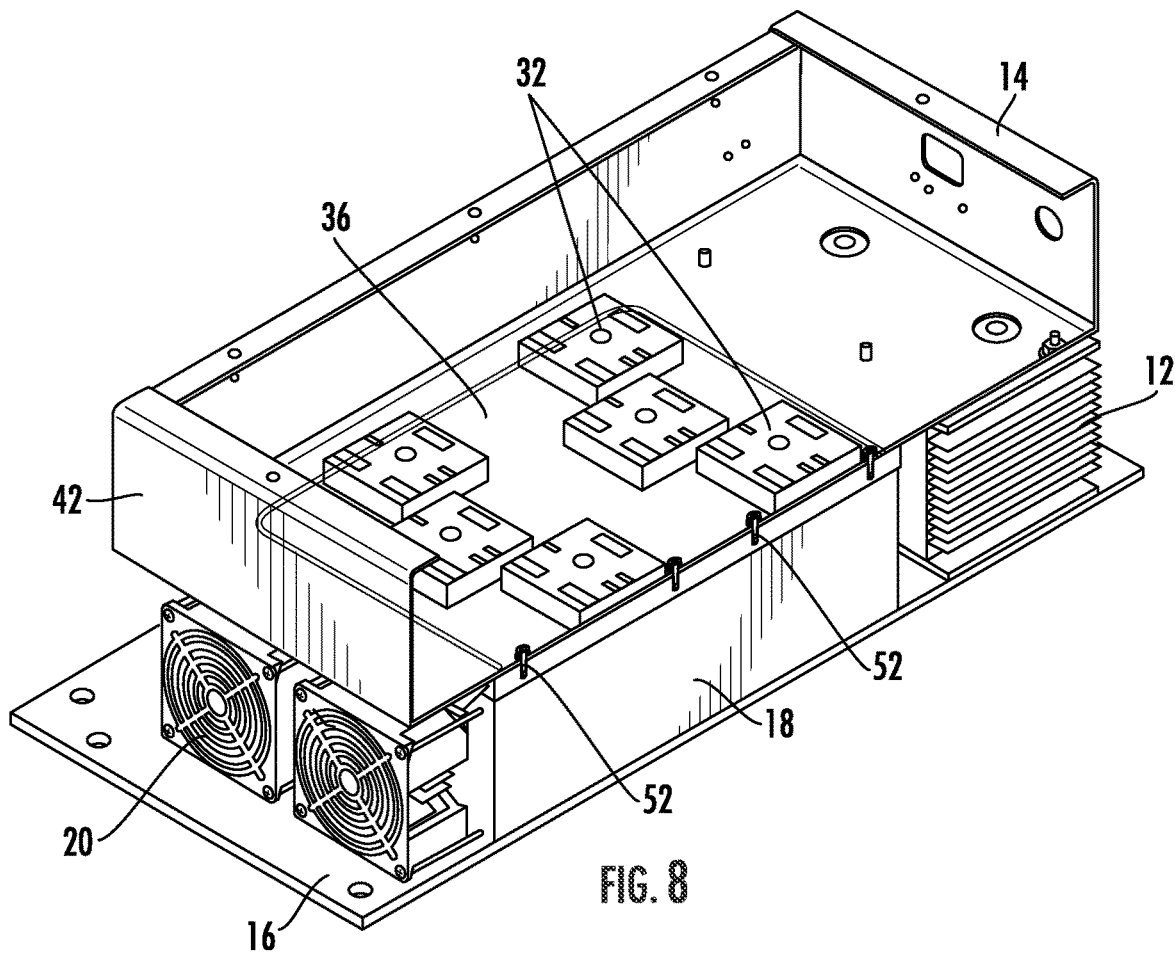
FIG. 8 is another partial cross-sectional view of an embodiment of a mechanical assembly.
Figure 9:
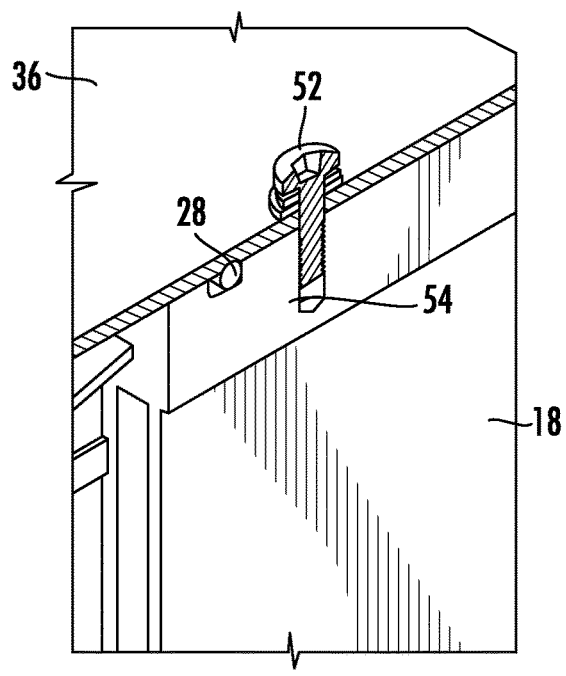
FIG. 9 is a partial cross-sectional view illustrating securing of the mechanical enclosure to the heat sink.

Referring now to FIGS. 4 and 5, the mechanical enclosure 14 is secured to the base plate 16 and to the top surface 30 of the heatsink 18. The mechanical enclosure 14 is formed from, for example, sheet metal, and includes a base surface 34 (shown in FIG. 6) and a shelf surface 36 connected to the base surface 34 via an upright surface 38. The base surface 34 is secured to the base plate 16, and the shelf surface 36 is located over the top surface 30 of the heatsink 18 and is secured thereto by, for example, screws 40. The base surface 34, shelf surface 36 and upright surface 38 are surrounded by enclosure sidewalls 42. Further, the shelf surface 36 includes an opening 44 for each of the IGBT's 32 such that when the mechanical enclosure 14 is installed to the heatsink 18, the IGBT's 32 protrude into an interior of the mechanical enclosure 14 via the openings 44. The heatsink gasket 28 located between the shelf surface 36 and the top surface 30 of the heatsink 30 prevents intrusion of foreign matter into the mechanical enclosure 14 through the openings 44. As shown in FIGS. 6 and 7, the base surface 34 of the mechanical enclosure 14 is secured to the base plate 16 by base screws 46 installed into self-clinching inserts 48. In some embodiments, the inserts 48 are installed in the base surface 34 and the base screws 46 are installed through the base plate 16 into the inserts 48. Before the base surface 34 is secured to the base plate 16, a base gasket 50 may be installed between the base surface 34 and the base plate 16 to seal the interface. Similarly, referring to FIGS. 8 and 9, the shelf surface 36 is secured to the heatsink 18, with one or more shelf screws 52 installed through the shelf surface 36 and into tapped heat sink holes 54 in the heatsink 18.

Figure 10:
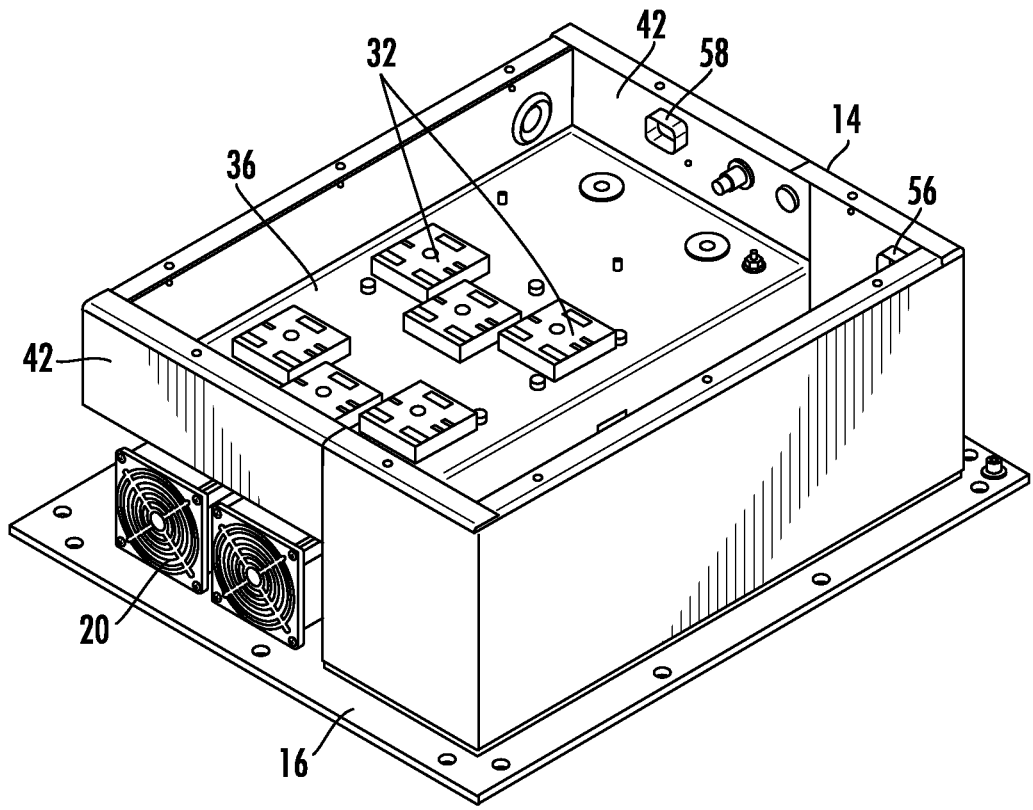
FIG. 10 is yet another perspective view of an embodiment of a mechanical assembly.
Figure 11:
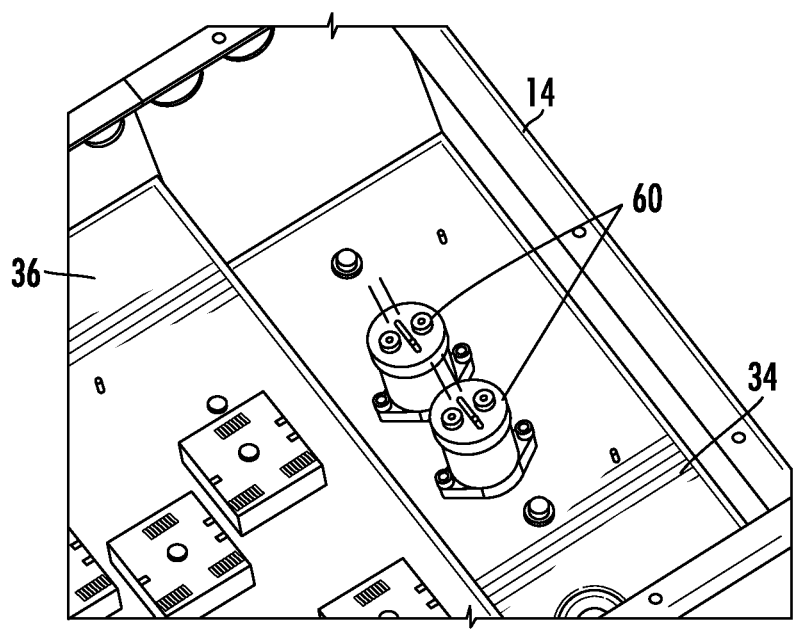
FIG. 11 is a perspective view illustrating installation of electronic components to the mechanical enclosure.
Figure 12:
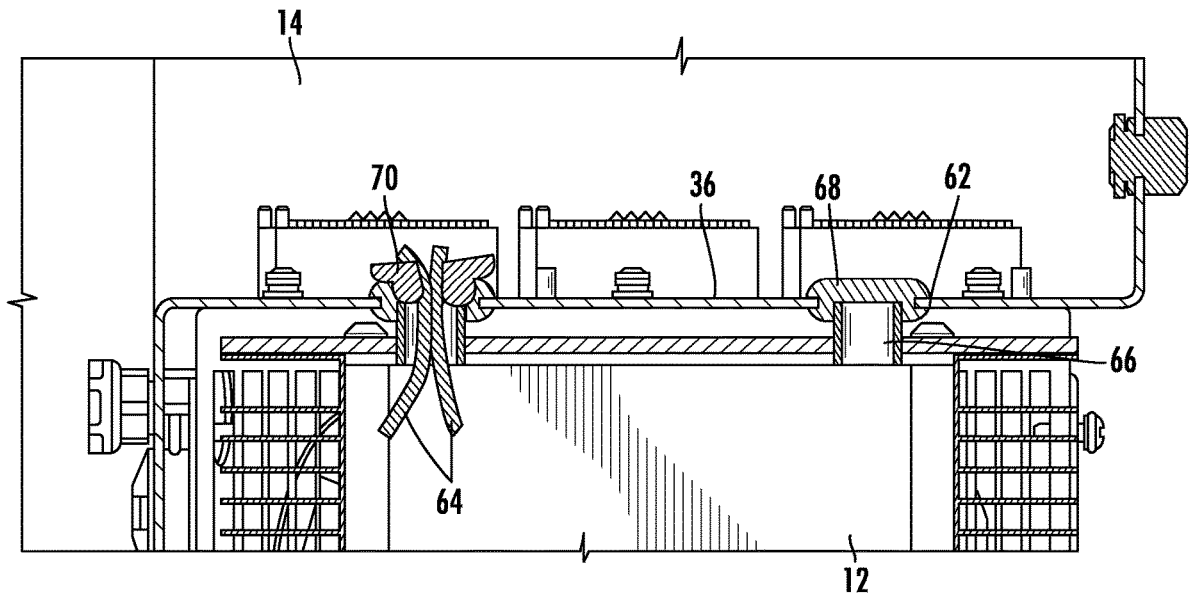
FIG. 12 is another partial cross-sectional view of an embodiment of a mechanical assembly.
Figure 13:
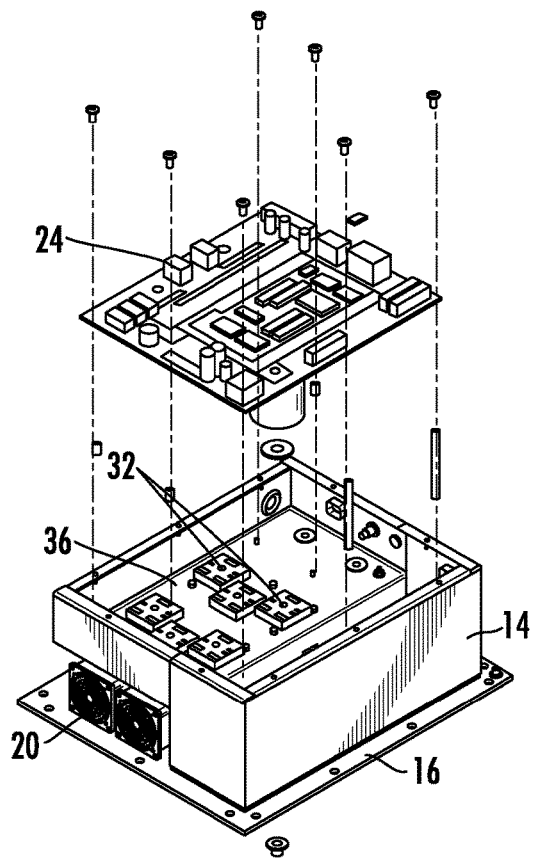
FIG. 13 is another perspective view illustrating installation of electronic components to the mechanical enclosure.
Figure 14:
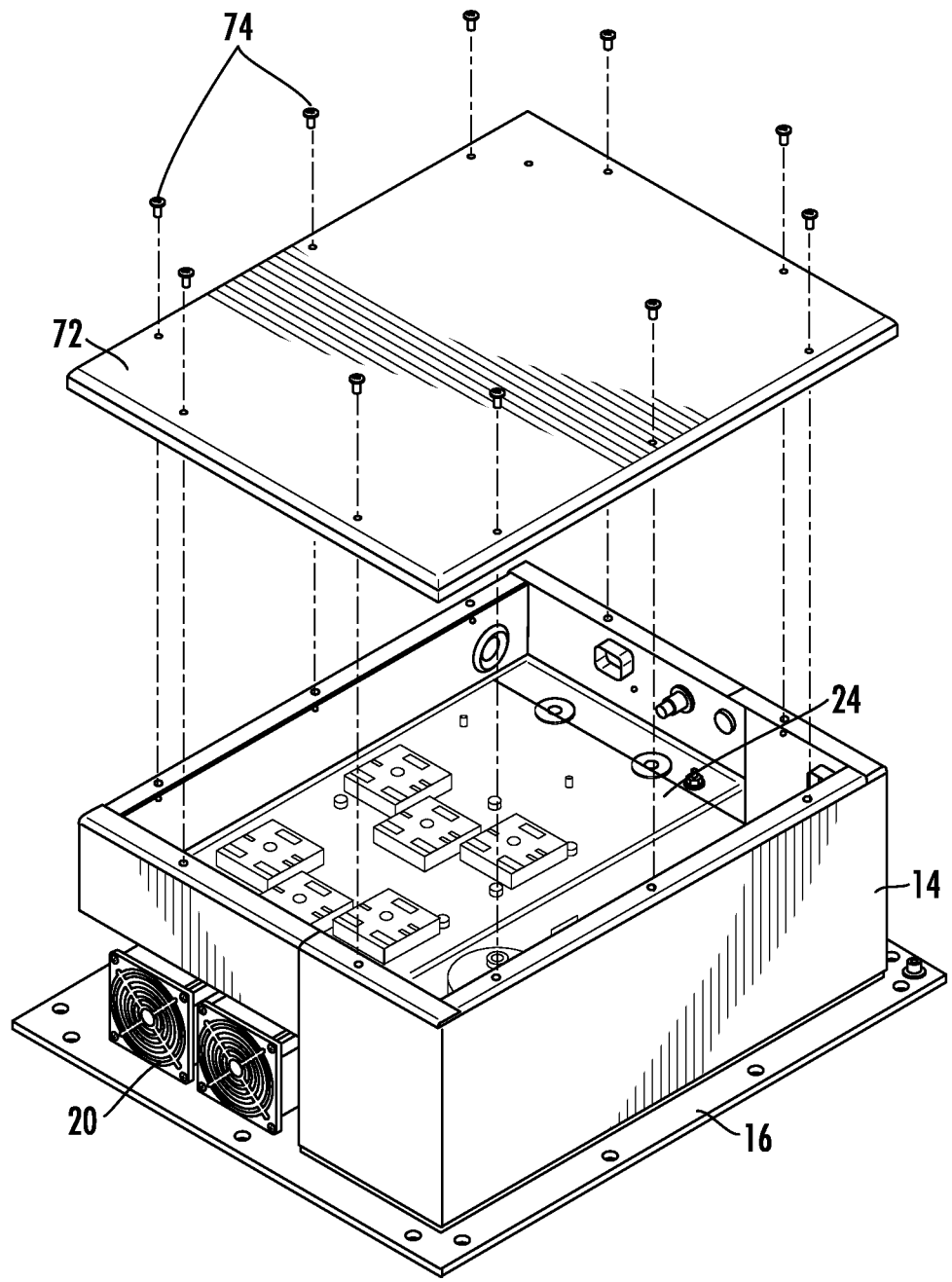
FIG. 14 is a perspective view illustrating installation of a top cover to the mechanical enclosure.
Figure 15:
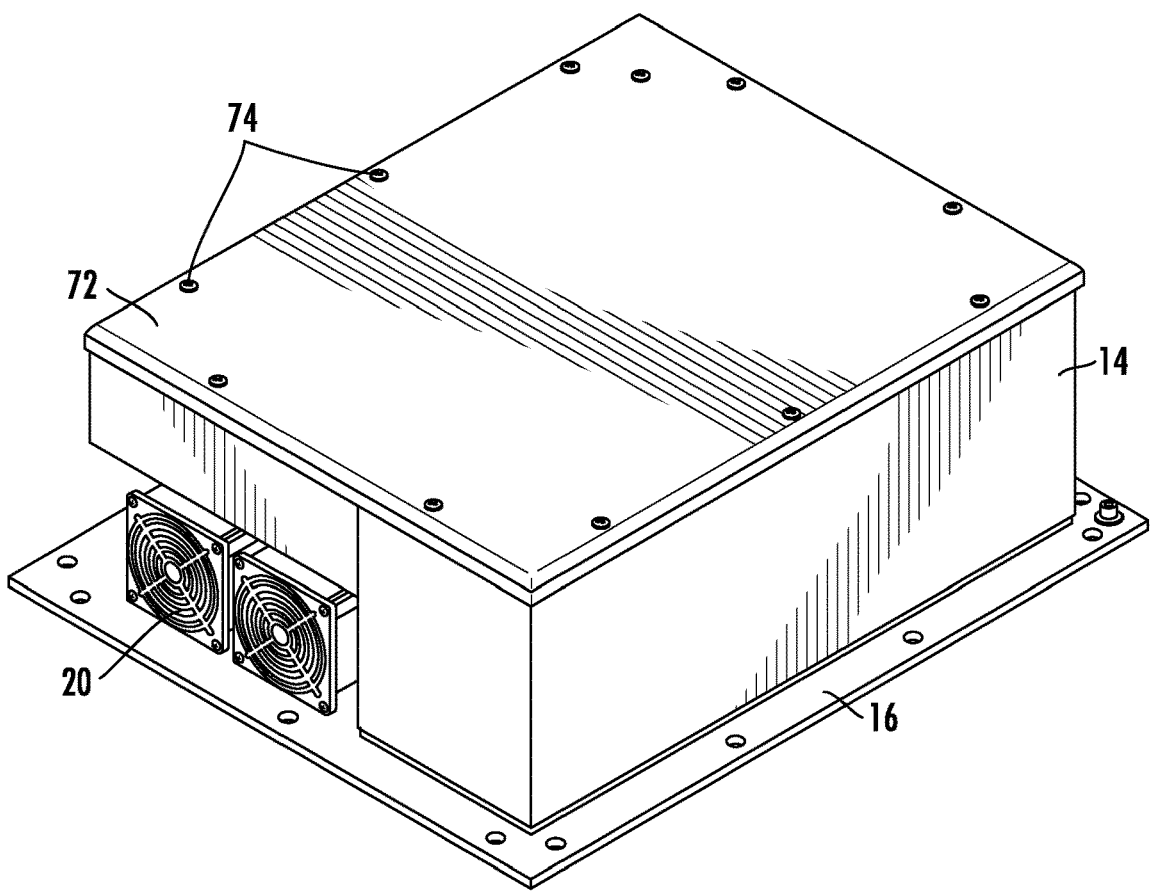
FIG. 15 is a perspective view of the top cover installed to the mechanical enclosure.
Figure 16:
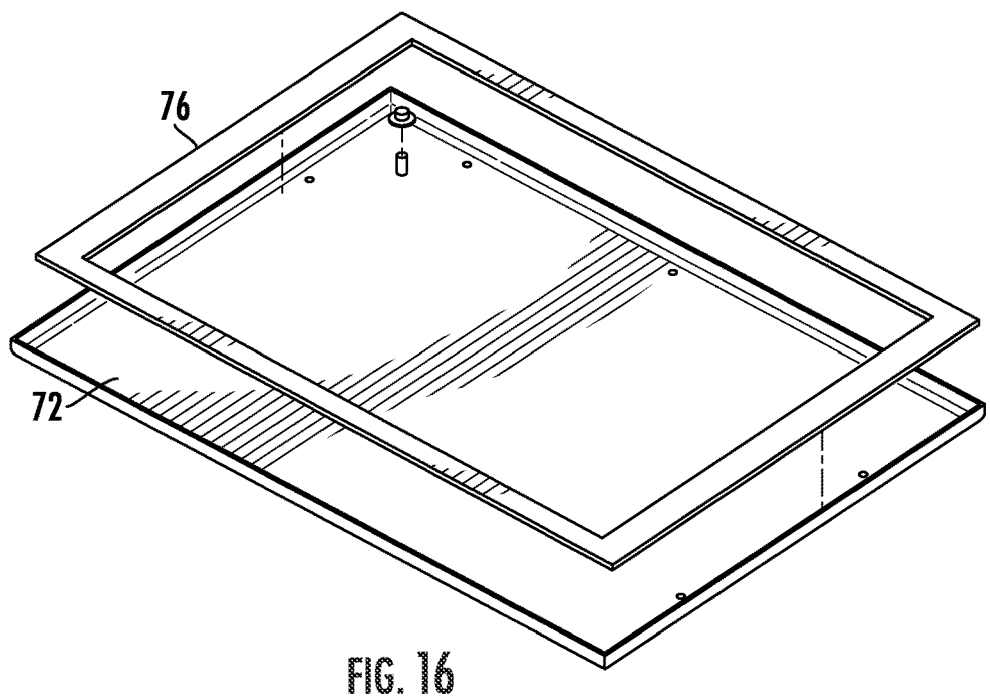
FIG. 16 is a perspective view of an embodiment of a top cover.

Referring to FIG. 10, components such as a DC power input port 56 and an AC power output port 58 are installed in an enclosure sidewall 42 of the mechanical enclosure 14. Further, as shown in FIG. 11, DC contactors 60 are installed in the mechanical enclosure 14, at for example, the base surface 34. Referring now to FIG. 12, one or more shelf ports 62 are defined in the shelf surface 36 to allow for conductors 64 to extend between the inductor 12 outside of the mechanical enclosure 14 and the interior of the mechanical enclosure 14. In some embodiments, the inductor 12 includes a tubular passage 66 extending toward the mechanical enclosure 14, with a grommet 68 disposed between an exterior of the tubular passage 66 and the shelf port 62 to seal between the shelf port 62 and the tubular passage 66. Further potting compound 70 may be installed inside of the tubular passage 66 to provide further ingress protection. Shown in FIG. 13, the PCBA 24 is installed to the IGBT's 32 in the mechanical enclosure 14. Next, as shown in FIGS. 14 and 15 a top cover 72 is installed over the mechanical enclosure 14 to enclose the PCBA 24 and other components therein. The top cover 72 may be secured to the mechanical enclosure 14 by, for example, a plurality of cover screws 74. Referring now to FIG. 16, the top cover 72 may include a cover gasket 76, which when the top cover 72 is installed to the mechanical enclosure 14 seals the interface between the top cover 72 and the mechanical enclosure 14.

The power converter 10 disclosed herein enables a single cooling fan set to cool both the PCBA 24 residing inside of the mechanical enclosure 14 and the inductor 12 via a common or shared air pathway 22. The arrangement achieves a high IP rating thus preventing ingress of foreign material into the mechanical enclosure 14 and into the inductor 12, while providing a compact solution that meets constrained space requirements.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A mechanical assembly, comprising:
   a power semiconductor device disposed inside of a mechanical enclosure; and
   a magnetic component disposed outside of the mechanical enclosure and operably connected to the power semiconductor device;
   wherein the power semiconductor device and the magnetic component are cooled via a common air pathway outside of the mechanical enclosure;
   wherein the magnetic component and the mechanical enclosure are secured to a common base plate;
   wherein the mechanical enclosure includes:
     a base surface secured to the base plate;
     a shelf surface vertically offset from the bottom surface; and
     an upright surface extending between the base surface and the shelf surface; and
   wherein the power semiconductor device is operably connected to the magnetic component via a shelf port formed in the shelf surface.

2. The mechanical assembly of claim 1, further comprising a heat sink disposed outside of the mechanical enclosure in the common air pathway, the heat sink operably connected to the power semiconductor device.

3. The mechanical assembly of claim 2, wherein the mechanical enclosure is secured to the heat sink.

4. The mechanical assembly of claim 3, further comprising a heat sink gasket disposed between the mechanical enclosure and the heat sink to seal an interface between the mechanical enclosure and the heat sink.

5. The mechanical assembly of claim 4, wherein the power semiconductor device is operably connected to the heat sink via one or more opening in the mechanical enclosure inside of a perimeter defined by the heat sink gasket.

6. The mechanical assembly of claim 1, further comprising one or more of a grommet and/or a potting compound disposed at the shelf port.

7. The mechanical assembly of claim 1, further comprising a cover installed to the mechanical enclosure.

8. A power converter, comprising:
   a powered semiconductor device disposed inside of a mechanical enclosure, the power semiconductor device configured to convert DC input power to AC output power; and
   an inductor disposed outside of the mechanical enclosure and operably connected to the power semiconductor device;
   wherein the power semiconductor device and the magnetic component are cooled via a common air pathway outside of the mechanical enclosure;
   wherein the inductor and the mechanical enclosure are secured to a common base plate;
   wherein the mechanical enclosure includes:
     a base surface secured to the base plate;
     a shelf surface vertically offset from the bottom surface; and
     an upright surface extending between the base surface and the shelf surface; and
   wherein the power semiconductor device is operably connected to the inductor via a shelf port formed in the shelf surface.

9. The power converter of claim 8, wherein the power semiconductor device includes a printed circuit board assembly.

10. The power converter of claim 8, further comprising a heat sink disposed outside of the mechanical enclosure in the common air pathway, the heat sink operably connected to the power semiconductor device.

11. The power converter of claim 10, wherein mechanical enclosure is secured to the heat sink.

12. The power converter of claim 11, further comprising a heat sink gasket disposed between the mechanical enclosure and the heat sink to seal an interface between the mechanical enclosure and the heat sink.

13. The power converter of claim 12, wherein the power semiconductor device is operably connected to the heat sink via one or more opening in the mechanical enclosure inside of a perimeter defined by the heat sink gasket.

14. The power converter of claim 8, further comprising one or more of a grommet and/or a potting compound disposed at the shelf port.

* * * * *